United States Patent [19]
Dobbelaere et al.

[11] Patent Number: 6,097,245
[45] Date of Patent: Aug. 1, 2000

[54] DIFFERENTIAL OUTPUT AMPLIFIER ARRANGEMENT AND METHOD FOR TUNING THE OUTPUT IMPEDANCE OF A DIFFERENTIAL OUTPUT AMPLIFIER

[75] Inventors: Philippe Guillaume Dobbelaere, Wilrijk; Rudi Verbist, Schriek; François Jeanjean, Wemmel; Jean-Philippe Robert Adiel Cornil, Edingen, all of Belgium

[73] Assignee: Alcatel, Paris, France

[21] Appl. No.: 09/145,619

[22] Filed: Sep. 2, 1998

[30] Foreign Application Priority Data

Sep. 5, 1997  [EP]  European Pat. Off. ............. 97402068

[51] Int. Cl.⁷ ............................ G06G 7/12; G06G 7/26
[52] U.S. Cl. ....................... 327/560; 327/561; 327/563; 330/84
[58] Field of Search ................... 327/65, 67, 560, 327/561, 562, 563; 330/69, 84, 124 R

[56] References Cited

U.S. PATENT DOCUMENTS

| 3,516,006 | 6/1970 | Donjon | 330/84 |
| 3,982,196 | 9/1976 | Poujois | 330/9 |
| 4,242,741 | 12/1980 | Parrish | 367/21 |
| 5,315,267 | 5/1994 | Chambers | 330/275 |

FOREIGN PATENT DOCUMENTS 0449200  10/1991  European Pat. Off. .
4104714  8/1992  Germany .

OTHER PUBLICATIONS

"Aktiver Aufwartstransformator", Radio Fernsehen Elektronik, vol. 43, No. 8, Aug. 1, 1994 p. 63 XP000490847.

"Microelectronics: digital and analog circuits and systems" by J. Millman—ISBN nr 0-07-066410-2, Ed 1983, pp. 574–575. (A tutorial handbook).

Primary Examiner—Terry D. Cunningham
Assistant Examiner—Anh-Quan Tra
Attorney, Agent, or Firm—Ware, Fressola, Van Der Sluys & Adolphson LLP

[57] ABSTRACT

A differential output amplifier arrangement (DOA) including two operational amplifiers (OA1,OA2), each having a feedback resistor (R2,R20), and which are coupled by a first resistor (R1) between similar polarity type input terminals, further includes a pair of output resistors (R3,R30), coupled between respective output terminals (OUT1,OUT2), of each respective operational amplifier, and corresponding respective output terminals (ZOUT1,ZOUT2) of said arrangement, and a pair of resistors (R4,R40), each of which is cross-coupled between a respective output terminal of said arrangement (ZOUT1,ZOUT2) and one of the two similar polarity type, by the first resistor coupled, input terminals (INN2,INN1) of the respective cross-coupled operational amplifier. A method for adapting the output impedance of a differential output amplifier arrangement is described as well.

9 Claims, 1 Drawing Sheet

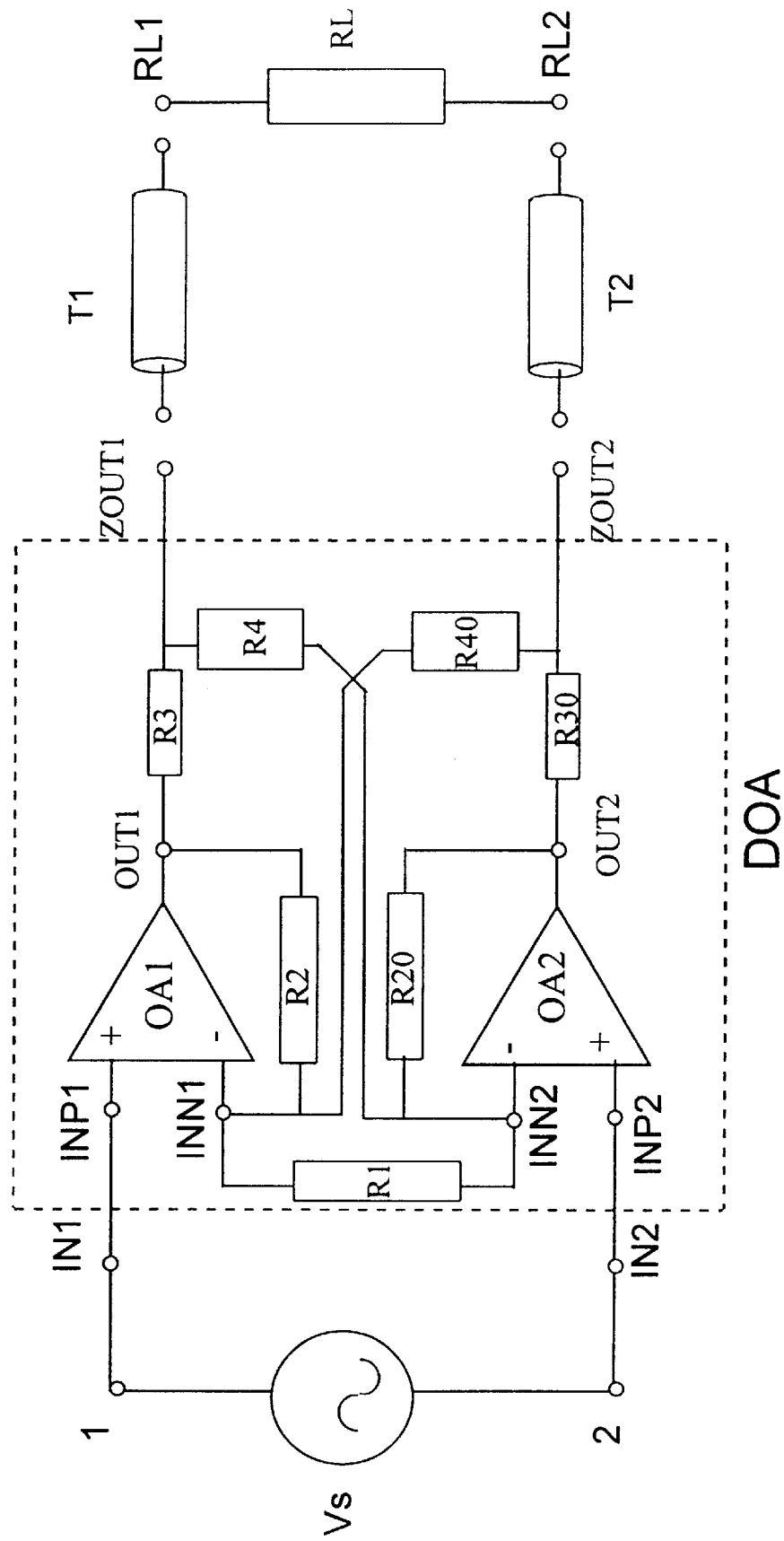

DIFFERENTIAL OUTPUT AMPLIFIER ARRANGEMENT AND METHOD FOR TUNING THE OUTPUT IMPEDANCE OF A DIFFERENTIAL OUTPUT AMPLIFIER

TECHNICAL FIELD

The present invention relates to a differential output amplifier arrangement (DOA).

BACKGROUND OF THE INVENTION

Such a differential output amplifier arrangement is already known from standard operational amplifier theory, such as for instance described in the tutorial handbook *"Microelectronics: digital and analog circuits and systems"*, by J. Millman—ISBN nr 0-07-066410-2, Ed 1983. Therein, on page 575, in FIG. 16.8, an improved instrumentation amplifier is shown whereby the first stage consisting of two operational amplifiers A1 and A2, the inverting input terminals of which are coupled via a coupling resistor R, and each amplifier having a feedback resistor R', is a differential output amplifier, as is also mentioned on the same page of the prior art document. This differential output amplifier corresponds to a differential output amplifier arrangement including a first arrangement input terminal and a second arrangement input terminal for respectively coupling to a first terminal and a second terminal of an input signal source, the differential output amplifier arrangement further including a first arrangement output terminal and a second arrangement output terminal for delivering a differential output voltage between the first arrangement output terminal and the second arrangement output terminal, the differential output amplifier arrangement further including a first operational amplifier having a first amplifier input terminal of a first polarity type, and coupled to the first arrangement input terminal, the first operational amplifier having a second amplifier input terminal of a second polarity type opposite to the first polarity type, and an amplifier output terminal coupled to the first arrangement output terminal, a second operational amplifier having a first input terminal of the first polarity type, and coupled to the second arrangement input terminal of the second polarity type, coupled via a first resistor with the second amplifier input terminal of the first operational amplifier, the second operational amplifier further including an output terminal coupled to the second arrangement output terminal, the amplifier output terminal of the first operational amplifier being coupled to the second amplifier input terminal of the first operational amplifier via a second resistor, the output terminal of the second operational amplifier being coupled to the second input terminal of the second operational amplifier via third resistor. Indeed, the respective prior art amplifiers A1 and A2 correspond to the respective first and second operational amplifiers OA1 and OA2, the prior art coupling resistor R corresponds to the first resistor R1, and the two feedback resistors denoted R' in the prior art document correspond with the second and third resistors, as described above.

Such a differential output amplifier has the advantage of having a very high input resistance, as well as an excellent common mode rejection ratio.

When using such a differential output amplifier for delivering maximum power to a load, via transmission lines coupled to the differential output terminals of this amplifier, it is essential to match both the impedance of the load as well as the output impedance of this amplifier, to the line characteristic impedance. The classical solution for this matching consists of artificially increasing the output impedance of the differential output amplifier, by adding a resistor in series with each differential output terminal. For a characteristic impedance value of RL/2, the load series resistor in this differential output amplifier has to be equal to RL, whereas for each of the two differential output terminals, a series resistor with a resistance value of approximately RL/2, is to be coupled in between this terminal and the transmission line.

The resulting configuration however results in an increased power consumption, both in the added series resistors, as well as in both operational amplifiers themselves. This increased power consumption has a detrimental effect on the failure rate of the components, and thus also on the lifetime of the whole arrangement.

SUMMARY OF THE INVENTION

An object of the present invention is to provide a differential output amplifier arrangement of the above known type, adapted for matching with a predetermined load impedance, but with a reduced power consumption compared to the prior art solution.

According to the invention, this object is achieved due to the fact that the differential output amplifier arrangement includes additional resistors in a configuration wherein the amplifier output terminal of the first operational amplifier is coupled via a fourth resistor to the first arrangement output terminal, the output terminal of the second operational amplifier is coupled via a fifth resistor to the second arrangement output terminal, the first arrangement output terminal is coupled via a sixth resistor to the second input terminal of the second operational amplifier, the second arrangement output terminal is coupled via seventh resistor to the second amplifier input terminal of the first operational amplifier.

In this way, by not only adding a fourth resistor between the amplifier output terminal of the first operational amplifier and the first arrangement output terminal, and a fifth resistor between the output terminal of the second operational amplifier and the second arrangement output terminal, but by also adding in a cross-feedback topology the sixth, respectively the seventh resistor, between the first, respectively the second, arrangement output terminal and the second input terminal of the second, respectively the first operational amplifier, these fourth and fifth resistors, in series with the output terminals of both operational amplifiers, are now allowed to have a lower resistance value compared to the described prior art solution. A smaller series resistor not only reduces the power consumption in the resistor itself, but for having the same output power in the load, as in the prior art solution, the output current as delivered by both operational amplifiers, and consequently the power consumption of these operational amplifiers, is reduced as well. As a result the total power consumption of the entire arrangement is significantly reduced.

It may be further remarked that, by adding the sixth and seventh resistors, an additional degree of freedom is introduced compared to the prior art situation, which represents another important benefit of the present invention.

By letting the second and third resistors have substantially identical resistance values, a better load balance of the two operational amplifiers is obtained.

By letting respectively the fourth and fifth, and the sixth and seventh, resistors being substantially identical, not only a better load balance of both amplifiers is obtained, but also the design criteria and formulas, on the basis of which the values of these resistors can be selected for matching specific characteristics, become much simpler. It is also possible to have the resistance value of the second resistor to be smaller than the sum of the resistance values of the fourth and the sixth resistor.

By this, the thus obtained amplifier arrangement is a stable system from the point of view of system theory. This means that this arrangement will not oscillate.

The present invention also refers to a method for tuning the output impedance of a differential output amplifier arrangement to a predetermined value, the differential output amplifier arrangement including a first arrangement input terminal and a second arrangement input terminal for respectively coupling to a first terminal and a second terminal of an input signal source, the differential output amplifier arrangement further including a first arrangement output terminal and a second arrangement output terminal for delivering a differential output voltage between the first arrangement output terminal and the second arrangement output terminal, the differential output amplifier arrangement further including a first operational amplifier having a first amplifier input terminal of a first polarity type, coupled to the first arrangement input terminal, the first operational amplifier having a second amplifier input terminal of a second polarity type opposite to the first polarity type, and an amplifier output terminal coupled to the first arrangement output terminal, a second operational amplifier having a first input terminal of the first polarity type, and coupled to the second arrangement input terminal, a second input terminal of the second polarity type, coupled via a first resistor with the second amplifier input terminal of the first operational amplifier, the second operational amplifier further including an output terminal coupled to the second arrangement output terminal, the amplifier output terminal of the first operational amplifier thereby being coupled to the second amplifier input terminal of the first operational amplifier, via a second resistor, the output terminal of the second operational amplifier thereby being coupled to the second input terminal of the second operational amplifier via a third resistor, wherein the method includes the steps of coupling the amplifier output terminal of the first operational amplifier via a fourth resistor to the first arrangement output terminal, coupling the output terminal of the second operational amplifier via a fifth resistor to the second arrangement output terminal, coupling the first arrangement output terminal via a sixth resistor to the second input terminal of the second operational amplifier, coupling the second arrangement output terminal via a seventh resistor to the second amplifier input terminal of the first operational amplifier, and selecting values of respectively the second, third, fourth, fifth, sixth and seventh resistor to tune the output impedance of the arrangement to the predetermined value.

It also refers to such a method wherein the second resistor and the third resistor are selected to have substantially identical resistance values, the fourth resistor and the fifth resistor are selected to have substantially identical resistance values, the sixth resistor and the seventh resistor are selected to have substantially identical resistance values. The output impedance is given for the case of symmetrical resistance values for both amplifiers, on the basis of which these resistance values can then be chosen for obtaining the desired impedance.

BRIEF DESCRIPTION OF THE DRAWINGS

The above and other objects and features of the invention will become more apparent and the invention itself will be best understood by referring to the following description of an embodiment token in conjunction with the accompanying drawing depicting an embodiment DOA of a differential output amplifier arrangement according to the invention.

BEST MODE FOR CARRYING OUT THE INVENTION

The differential output amplifier arrangement DOA represented in the drawing has two arrangement input terminals, denoted by IN1 and IN2, coupled to respective terminals denoted 1 and 2, of a differential input signal source denoted Vs. The differential output arrangement DOA has two output terminals, denoted ZOUT1 and ZOUT2, the difference in output voltages appearing at both output terminals, constituting the differential output voltage of the arrangement.

The differential output amplifier arrangement includes a first operational amplifier, OA1, a first input terminal of which, denoted with INP1, is coupled with the first arrangement input terminal IN1. The output terminal OUT1 of the first operational amplifier, is coupled via a feedback resistor, denoted R2, to the second amplifier input terminal, INN1 of the first operational amplifier OA1. This second amplifier input terminal is of an opposite polarity type as the first amplifier input terminal INP1.

The differential output amplifier arrangement further includes a second operational amplifier, OA2, a first input terminal of which, denoted with INP2 is of the same polarity type as the first input terminal of the first operational amplifier, and coupled to the second arrangement input terminal IN2. The output terminal OUT2 of the second operational amplifier is coupled via a feedback resistor, denoted R20, to a second input terminal of this second operational amplifier, denoted INN2 and of the same type as the second amplifier input terminal INN1 of the first operational amplifier. Both second input terminals INN1 and INN2 of both operational amplifiers OA1 and OA2, are coupled to each other via a resistor R1.

Between both first input terminals of both amplifiers the differential input signal Vs is thus applied.

Remark that for stability reasons, both first input terminals INP1 and INP2 of both amplifiers OA1 and OA2, correspond to the non-inverting input terminals of these operational amplifiers, whereas the second input terminals INN1 and INN2, correspond to the inverting input terminals of both amplifiers, as is commonly known by a person skilled in the art.

The arrangement includes four more resistors: a fourth resistor, denoted R3 and coupled between the first amplifier output terminal OUT1 and the first arrangement output terminal ZOUT1; a fifth resistor, denoted R30, and coupled between the output terminal OUT2 of the second operational amplifier OA2 and the second arrangement output terminal ZOUT2; a sixth resistor, denoted R4 and coupled between the first arrangement output terminal ZOUT1 and the second input terminal INN2 of the second operational amplifier OA2; and a seventh resistor, denoted R40, and coupled between the second arrangement output terminal ZOUT2, and the second amplifier input terminal INN1 of the first operational amplifier OA1. The addition of these four resistors, makes it possible to tune the output impedance of the arrangement to a desired value, usually to match the value of a load impedance. This load impedance is represented in the drawing as a resistor RL, having two terminals RL1 and RL2, which are coupled via respective transmission lines T1 and T2 to the first and second arrangement output terminals ZOUT1 and ZOUT2.

The formula of the output impedance, ZOUT, on the basis of which the different values of the resistors may be selected is given for the case where the respective resistors R2 and R20, R3 and R30, and R4 and R40, have substantially identical resistance values. In this case the formula of the differential output impedance of DOA becomes rather simple, represented by formula (1):

$$ZOUT = \frac{2(R3 \cdot R4)}{(R3 + R4 - R2)} \quad (1)$$

whereby R2,R3 and R4 in this formula represent the resistance value of the R2 and R20, R3 and R30 and R4 and R40 respectively.

For ZOUT to match RL, values of R2,R3 and R4 can then be calculated based on this formula, whereby ZOUT is to be set equal to RL.

It has to be remarked that the characteristic impedance of transmission lines T1 and T2 have to be RL/2, for these matching purposes.

From formula (1), it is already clear that the sum of R3 and R4 has to exceed the value of R2, a requirement which can also be derived from stability analysis by a person skilled in the art.

The gain A of the arrangement is given by the following formula:

$$A = (RL) \cdot \frac{[R1 \cdot R2 - R1 \cdot R3 + R1 \cdot R4 + 2R2 \cdot R4]}{[2R1 \cdot R3 \cdot R4 + RL \cdot R1 \cdot R4 + RL \cdot R1 \cdot R3 - RL \cdot R1 \cdot R2]}$$

whereby R1,R2,R3,R4 and RL again represent the resistance values of respective resistors R1,R2 and R20, R3 and R30, R4 and R40, and RL.

Values of R1,R2,R3 and R4 can then be chosen based on these two formula's, taken into account the desired gain and output resistance, and other characteristics of the used operational amplifiers, such as gain-bandwidth product.

Remark that both formula's were obtained for "ideal" operational amplifiers, having an infinite input impedance and open loop gain and a zero output impedance. Since in reality these ideal amplifiers do not exist, some precautions need to be taken when selecting values for the resistors, as will be explained by the following example.

In an embodiment of for instance an asynchronous digital subscriber line, abbreviated with ADSL, line driver, terminating both sides at a transmission line, of which the characteristic impedance is transformed by a hybrid to have an equivalent value of 12.5 Ohm observed at the output of both operational amplifiers, the load resistor RL has an equivalent resistance value of 25 Ohm for matching purposes. A prerequisite value from surrounding system considerations, which fall beyond the scope of this invention, implies the gain A of the arrangement to be 17.72. For this embodiment following operational amplifiers and resistance values are used:

the operational amplifiers are current amplifiers, of for instance the type AD816, because of their excellent current drive capability, and a low high frequency distortion; these characteristic being again a prerequisite for this application as is known by a person skilled in the art;

R2 and R20 are selected to be 1000 Ohm, to obtain the desired gain-bandwidth product for this kind of amplifier. These values are provided from data sheets provided by the manufacturers of these amplifiers;

R3 and R30 should on one hand be as small as possible, to allow maximum power to the load. Since the operational amplifiers are not ideal and in a closed-loop configuration by the presence of the feedback resistors R2 and R20, the non-zero output impedance of these amplifiers adds to the value of resistors R3 and R30 in both formula's. To minimise this effect, the resistance values for these latter resistors are selected to be at least one order of magnitude larger than the value of the amplifier output impedance. A value of 3.92 Ohm is therefore selected for both R3 and R30.

from the two equations, the values of R1 and R4 are then calculated to have a value of respectively 1451 Ohm and 212 Ohm.

If compared to the prior art situation, for delivering the same power to the load as compared to the prior art situation, due to the reduction of the voltage drop over the fourth and fifth resistors R3 and R30, the dynamic range of both amplifiers is increased. For obtaining the same dynamic range, while delivering the same power to the load as in the prior art situation, the supply voltage of both amplifiers may be reduced, still presenting an additional advantage.

While the principles of the invention have been described above in connection with specific apparatus, it is to be clearly understood that this description is made only by way of example and not as a limitation on the scope of the invention.

What is claimed is:

1. A differential output amplifier arrangement (DOA) with reduced power consumption, the differential output amplifier arrangement including a first arrangement input terminal (IN1) and a second arrangement input terminal (IN2) for respectively coupling to a first terminal (1) and a second terminal (2) of an input signal source (Vs), said differential output amplifier arrangement (DOA) further including a first arrangement output terminal (ZOUT1) and a second arrangement output terminal (ZOUT2) for delivering a differential output voltage to an external electrical load between said first arrangement output terminal (ZOUT1) and said second arrangement output terminal (ZOUT2), said differential output amplifier arrangement (DOA) further including a first operational amplifier (OA1) having a first amplifier input terminal (INP1) of a first polarity type (+), and coupled to said first arrangement input terminal (IN1), said first operational amplifier (OA1) having a second amplifier input terminal (INN1) of a second polarity type (−) opposite to said first polarity type, and an amplifier output terminal (OUT1) coupled to said first arrangement output terminal (ZOUT1), a second operational amplifier (OA2) having a first amplifier input terminal (INP2) of said first polarity type (+), and coupled to said second arrangement input terminal (IN2), said second operational amplifier (OA2) having a second input terminal (INN2) of said second polarity type (−), coupled via a first resistor (R1) with said second amplifier input terminal (INN1) of said first operational amplifier (OA1), said second operational amplifier (OA2) further including an output terminal (OUT2) coupled to said second arrangement output terminal (ZOUT2)

said amplifier output terminal (OUT1) of said first operational amplifier (OA1) being coupled to said second amplifier input terminal (INN1) of said first operational amplifier (OA1) via a second resistor (R2), said output terminal (OUT2) of said second operational amplifier (OA2) being coupled to said second input terminal (INN2) of said second operational amplifier (OA2) via third resistor (R20), characterised in that said amplifier output terminal (OUT1) of said first operational amplifier (OA1) is coupled via a fourth resistor (R3) to said first arrangement output terminal (ZOUT1), said output terminal (OUT2) of said second operational amplifier (OA2) is coupled via a fifth resistor (R30) to said second arrangement output terminal (ZOUT2), said first arrangement output terminal (ZOUT1) is coupled via a sixth resistor (R4) to said second input terminal (INN2) of said second operational amplifier (OA2), said second arrangement output terminal (ZOUT2) is coupled via seventh resistor (R40) to said second amplifier input terminal (INN1) of said first operational amplifier (OA1).

2. A differential output amplifier arrangement according to claim 1, characterised in that said second resistor (R2) and said third resistor (R20) have substantially identical resistance values.

3. A differential output amplifier arrangement according to claim 1 characterised in that said fourth resistor (R3) and said fifth resistor (R30) have substantially identical resistance values.

4. A differential output amplifier arrangement according to claim 1, characterised in that said sixth resistor (R4) and said seventh resistor (R40) have substantially identical resistance values.

5. A differential output amplifier arrangement according to claim 4, characterised in that the resistance value of said second resistor (R2) is smaller than the sum of the resistance values of said fourth (R3) and said sixth resistor (R4).

6. A method for tuning the output impedance of a differential output amplifier arrangement (DOA) to a predetermined value, said differential output amplifier arrangement including a first arrangement input terminal (IN1) and a second arrangement input terminal (IN2) for respectively coupling to a first terminal (1) and a second terminal (2) of an input signal source (Vs), said differential output amplifier arrangement (DOA) further including a first arrangement output terminal (ZOUT1) and a second arrangement output terminal (ZOUT2) for delivering a differential output voltage to an external electrical load between said first arrangement output terminal and said second arrangement output terminal, said differential output amplifier arrangement (DOA) further including a first operational amplifier (OA1) having a first amplifier input terminal (INP1) of a first polarity type (+), coupled to said first arrangement input terminal (IN1), said first operational amplifier (OA1) having a second amplifier input terminal (INN1) of a second polarity type (−) opposite to said first polarity type, and an amplifier output terminal (OUT1) coupled to said first arrangement output terminal (ZOUT1), a second operational amplifier (OA2) having a first input terminal (INP2) of said first polarity type (+), and coupled to said second arrangement input terminal (IN2), a second input terminal (INN2) of said second polarity type (−), coupled via a first resistor (R1) with said second amplifier input terminal (INN1) of said first operational amplifier (OA1), said second operational amplifier (OA2) further including an output terminal (OUT2) coupled to said second arrangement output terminal (ZOUT2), said amplifier output terminal (OUT1) of said first operational amplifier (OA1) thereby being coupled to said second amplifier input terminal (INN1) of said first operational amplifier (OA1), via a second resistor (R2), said output terminal (OUT2) of said second operational amplifier (OA2) thereby being coupled to said second input terminal (INN2) of said second operational amplifier (OA2) via a third resistor (R20), characterised in that said method includes the steps of coupling said amplifier output terminal (OUT1) of said first operational amplifier (OA1) via a fourth resistor (R3) to said first arrangement output terminal (ZOUT1), coupling said output terminal (OUT2) of said second operational amplifier (OA2) via a fifth resistor (R30) to said second arrangement output terminal (ZOUT2), coupling said first arrangement output terminal (ZOUT1) via a sixth resistor (R4) to said second input terminal (INN2) of said second operational amplifier (OA2), coupling said second arrangement output terminal (ZOUT2) via a seventh resistor (R40) to said second amplifier input terminal (INN1) of said first operational amplifier (OA1), and selecting values of respectively said second, third, fourth, fifth, sixth and seventh resistor to tune said output impedance of said arrangement to said predetermined value.

7. A method according to claim 6 characterised in that said second resistor (R2) and said third resistor (R20) are selected to have substantially identical resistance values, said fourth resistor (R3) and said fifth resistor (R30) are selected to have substantially identical resistance values, said sixth resistor (R4) and said seventh resistor (R40) are selected to have substantially identical resistance values.

8. A method according to claim 7 characterised in that the resistance value of said second, (R2) said fourth (R3) and said sixth resistor are selected such that the resistance value of said second resistor (R2) is smaller than the sum of the resistance values of said fourth resistor (R3) and said sixth resistor (R4), dividing twice the product of the resistance values of said fourth resistor (R3) and said sixth resistor (R4) by the difference between the sum of the resistance values of said fourth resistor (R3) and said sixth resistor (R4), and the resistance value of said second resistor (R2), for obtaining said output impedance of said arrangement, the value of said output impedance thereby being substantially equal to said predetermined value.

9. A differential output amplifier arrangement according to claim 1, characterised in that the resistance value of said second resistor (R2) is smaller than the sum of the resistance values of said fourth (R3) and said sixth resistor (R4).

* * * * *